(12) United States Patent
Davis et al.

(10) Patent No.: US 6,403,151 B1
(45) Date of Patent: Jun. 11, 2002

(54) METHOD FOR CONTROLLING OPTICAL PROPERTIES OF ANTIREFLECTIVE COATINGS

(75) Inventors: Bradley Marc Davis, Austin; Craig William Christian, Buda; Allen Lewis Evans, Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/552,164

(22) Filed: Apr. 18, 2000

(51) Int. Cl.[7] .................................................. B05D 5/06
(52) U.S. Cl. ...................... 427/162; 427/8; 427/255.29; 427/255.37; 427/579; 204/192.1; 438/786; 438/787
(58) Field of Search .................................. 427/578, 579, 427/255.29, 255.37, 255.393, 255.394, 255.7, 166, 167, 8, 162; 204/192.1; 438/786, 787, 788, 791, 792

(56) References Cited

U.S. PATENT DOCUMENTS

| | | | | |
|---|---|---|---|---|
| 5,550,063 A | * | 8/1996 | Bogart et al. | 438/518 |
| 6,136,725 A | * | 10/2000 | Loan et al. | 438/758 |
| 6,271,052 B1 | * | 8/2001 | Miller et al. | 438/50 |

* cited by examiner

*Primary Examiner*—Bret Chen
(74) *Attorney, Agent, or Firm*—Williams, Morgan & Amerson

(57) ABSTRACT

A method is used by a semiconductor processing tool. The method comprises forming a first layer above a substrate layer, and forming an inorganic bottom antireflective coating layer above the first layer by introducing at least two gases at a preselected ratio into the semiconductor processing tools. A signal indicating that the semiconductor processing tool has been serviced is received, and the ratio of the gases is varied in response to receiving the signal to control optical parameters of the bottom antireflective coating layer to enhance subsequent photolithographic processes.

21 Claims, 7 Drawing Sheets

METHOD FOR CONTROLLING OPTICAL PROPERTIES OF ANTIREFLECTIVE COATINGS

BACKGROUND OF THE INVENTION

1. Field of the Invention

This invention relates generally to semiconductor fabrication technology, and, more particularly, to techniques for manufacturing semiconductor devices with reduced critical dimensions.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. All other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires being able to form and pattern components such as the gate conductor and gate dielectric on such reduced scales, consistently, robustly and reproducibly, preferably in a self-aligned manner. The ability to form and pattern components such as the gate conductor and gate dielectric on such reduced scales, consistently, robustly and reproducibly, is limited by, among other things, physical limits imposed by photolithography. Diffraction and reflection effects impose limits on the critical dimensions of components such as gate conductors and gate dielectrics.

One conventional approach to achieving reduced critical dimensions involves placing an inorganic bottom antireflective coating (BARC) beneath a layer of photoresist to reduce reflections and refractions during the photolithographic process. Silicon oxynitride is one type of BARC typically used in semiconductor processing. Ordinarily, the silicon oxynitride layer is formed in an atmosphere that includes silane (SiH4) and nitrous oxide (N2O). Typically, a desirable ratio of silane and nitrous oxide that provides desirable optical properties, such as the refractive index (n) and extension coefficient (k), is determined empirically or experimentally, and thereafter, the process attempts to hold the determined ratio constant so that the optical properties, n and k, will remain constant also.

However, factors other than the ratio of silane and nitrous oxide also impact the optical properties, n and k. The silicon oxynitride layer is typically formed in a semiconductor processing tool, such as a deposition chamber. Variations within the chamber can impact the optical properties of the silicon oxynitride. For example, an abrupt variation in the optical properties, n and k, has been observed following servicing of the tool. In particular, an insitu cleaning of the chamber can have a significant impact on the optical properties, n and k. These variations in optical properties can result in variations in the quality of semiconductor products produced.

The present invention is directed to overcoming, or at least reducing the effects of, one or more of the problems set forth above.

SUMMARY OF THE INVENTION

In one aspect of the present invention, a method is provided. The method is used to control a semiconductor processing tool. The method includes forming a first layer above a substrate layer, and forming an inorganic bottom antireflective coating layer above the first layer by introducing at least two gases at a preselected ratio into the semiconductor processing tools. A signal indicating that the semiconductor processing tool has been serviced is received, and the ratio of the gases is varied in response to receiving the signal.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
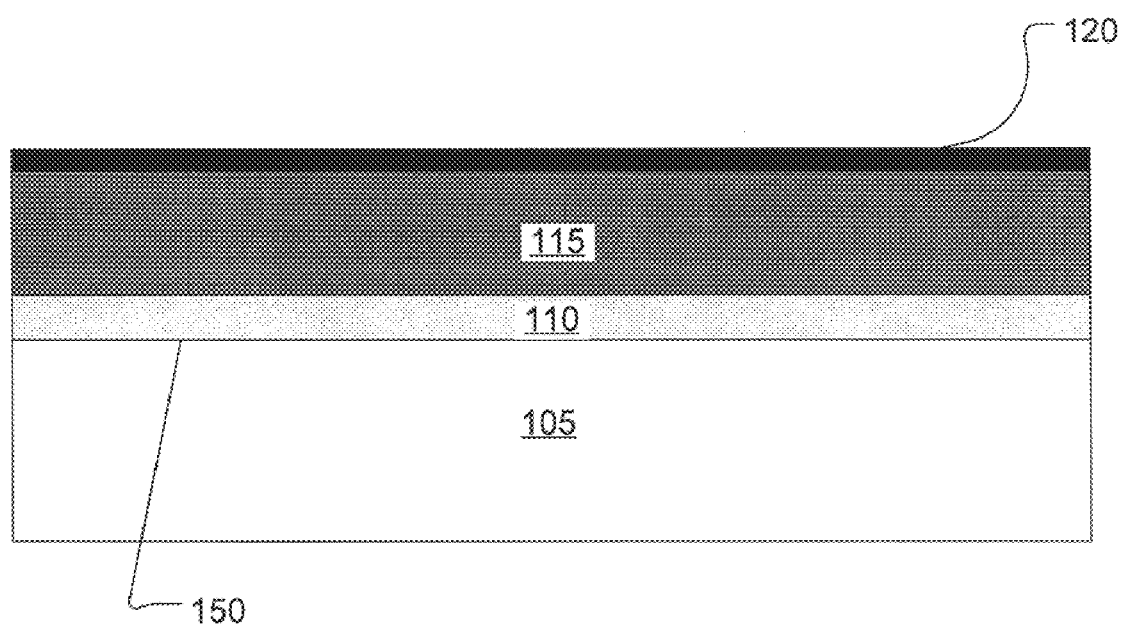
FIGS. 1–3 illustrate schematically in cross-section various embodiments of a method for semiconductor device fabrication according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure Illustrative embodiments of a method for semiconductor device fabrication according to the present invention are shown in FIGS. 1–7. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed toward the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

FIGS. 1–7 illustrate a method of forming a portion of an MOS transistor (not shown) according to the present invention. As shown in FIG. 1, a dielectric layer 110 may be formed above an upper surface 150 of a semiconducting substrate 105, such as doped-silicon. The dielectric layer 110 may be formed by a variety of known techniques for forming such layers, e.g., chemical vapor deposition (CVD), low-pressure CVD (LPCVD), plasma-enhanced CVD (PECVD), sputtering and physical vapor deposition (PVD), thermal growing, and the like. The dielectric layer 110 may have a thickness above the upper surface 150 ranging from approximately 25–50 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The dielectric layer 110 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like.

As shown in FIG. 1, a conductive layer 115 may be formed above the dielectric layer 110. The conductive layer 115 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 500–5000 Å. The conductive layer 115 may be formed of a variety of metals such as aluminum (Al), titanium (Ti), zirconium (Zr), tungsten (W), tantalum (Ta), nickel (Ni), molybdenum (Mo), cobalt (Co), and the like.

In various alternative illustrative embodiments, the conductive layer 115 may be a doped-polysilicon conductive layer 115. The doped-polysilicon conductive layer 115 may be formed by a variety of known techniques for forming such layers, e.g., CVD, LPCVD, PECVD, PVD, and the like, and may have a thickness ranging from approximately 500–5000 Å. In one illustrative embodiment, the doped-polysilicon conductive layer 115 has a thickness of approximately 2000 Å and is formed by an LPCVD process for higher throughput.

The doped-polysilicon conductive layer 115 may be doped with arsenic (As) for an NMOS transistor, for example, or boron (B) for a PMOS transistor, to render the poly more conductive. The poly may be formed undoped, by an LPCVD process for higher throughput, to have a thickness ranging from approximately 1000–2000 Å, for example. The doping of the poly may conveniently be accomplished by diffusing or implanting the dopant atoms and/or molecules through the upper surface of the poly. The doped-polysilicon conductive layer 115 may then be subjected to a heat-treating process that may be a rapid thermal anneal (RTA) process performed at a temperature ranging from approximately 800–1100° C. for a time ranging from approximately 5–60 seconds.

As shown in FIG. 1, an inorganic bottom antireflective coating (BARC) layer 120, such as silicon oxynitride, may be used in deep ultraviolet (DUV) photolithography, and may be formed above the conductive layer 115. In one embodiment, the BARC layer 120 is formed having a thickness in the range of about 100 to 500 Å by exposing the wafer to an atmosphere of silane and nitrous oxide having a ratio of about 1:1 for a period of time in the range of about 2 to 10 seconds. As discussed below in conjunction with FIG. 4, the ratio of silane and nitrous oxide may be adaptively varied to control the optical parameters, n and k, of the BARC layer 120.

Figure 2:
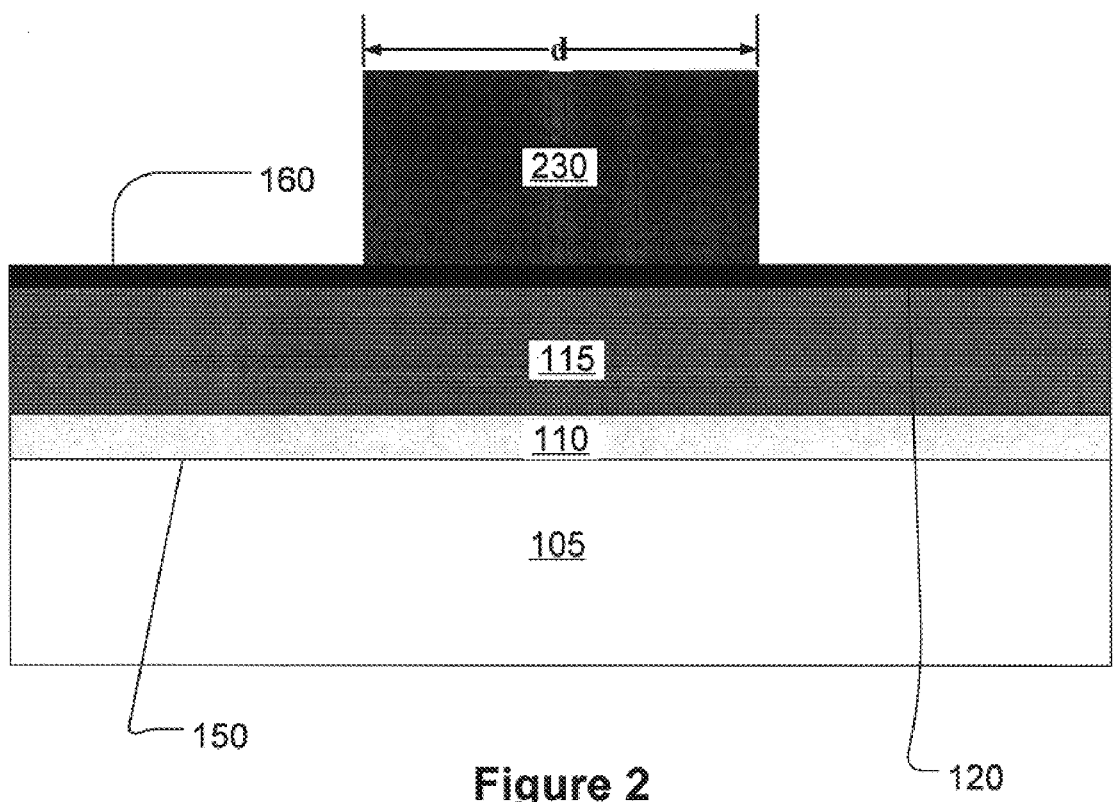

As shown in FIG. 2, a photoresist mask 230 may be formed above an upper surface 160 of the inorganic bottom antireflective coating (BARC) layer 120. The photoresist mask 230 may be patterned using any of a variety of photolithographic techniques, such as deep ultraviolet (DUV) photolithography. As shown in FIG. 2, using current generation technology, the patterned deep ultraviolet (DUV) photoresist mask 230 may have a smallest, diffraction-limited dimension d that may be in a range of about 1500–2500 Å. Of course, continual efforts are being made to improve photolithographic techniques so as to produce smaller and smaller devices. The present invention may be used even as photolithographic techniques continue to improve.

Figure 3:
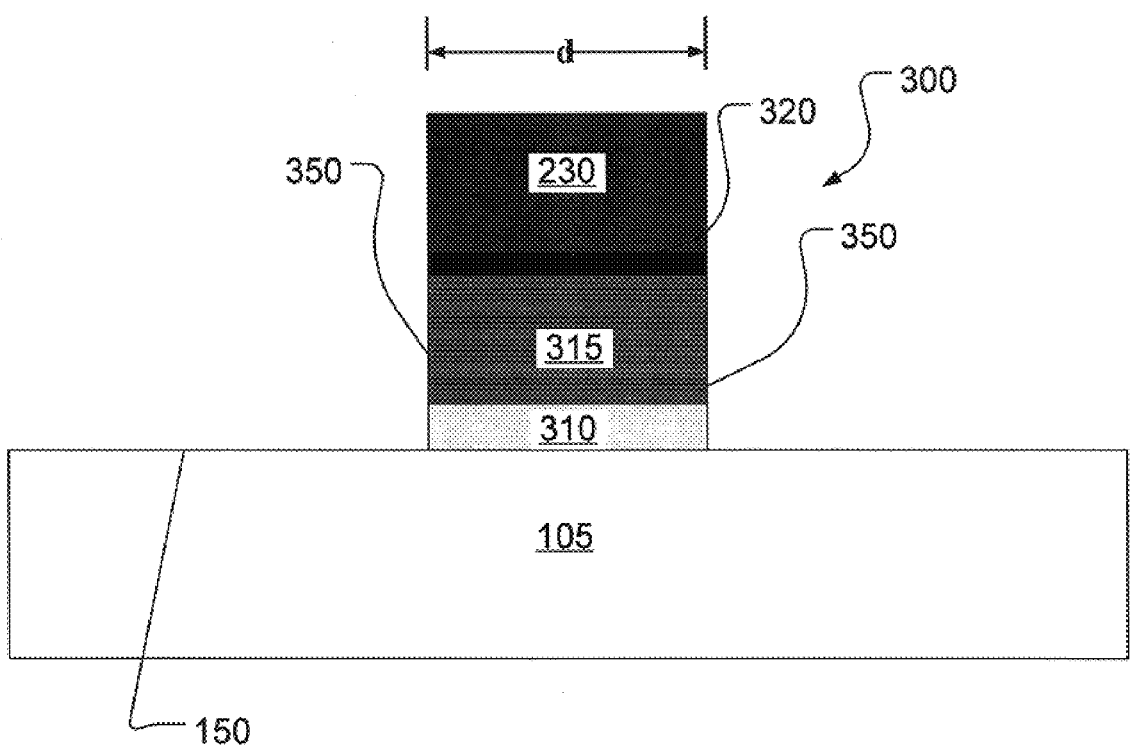

As shown in FIG. 3, the deep ultraviolet (DUV) photoresist mask 230 having the critical dimension d is then used as a mask to form a masked gate stack 300, having edges 350. The masked gate stack 100 may include the deep ultraviolet (DUV) photoresist mask 230, a remnant 320 of the inorganic bottom antireflective coating (BARC) layer 120, the gate conductor 315, and the gate dielectric 310. The masked gate stack 300 may be formed by removing portions of the dielectric layer 110, the conductive layer 115 and the inorganic bottom antireflective coating (BARC) layer 120 not protected by the deep ultraviolet (DUV) photoresist mask 230, using an anisotropic etching process, for example. The masked gate stack 300 will have the critical dimension d defined by the deep ultraviolet (DUV) photoresist mask 230.

The masked gate stack 300 may be formed using a variety of known etching techniques, such as an anisotropic etching process. A selective anisotropic etching technique may be used, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used, in various illustrative embodiments.

Figure 4:
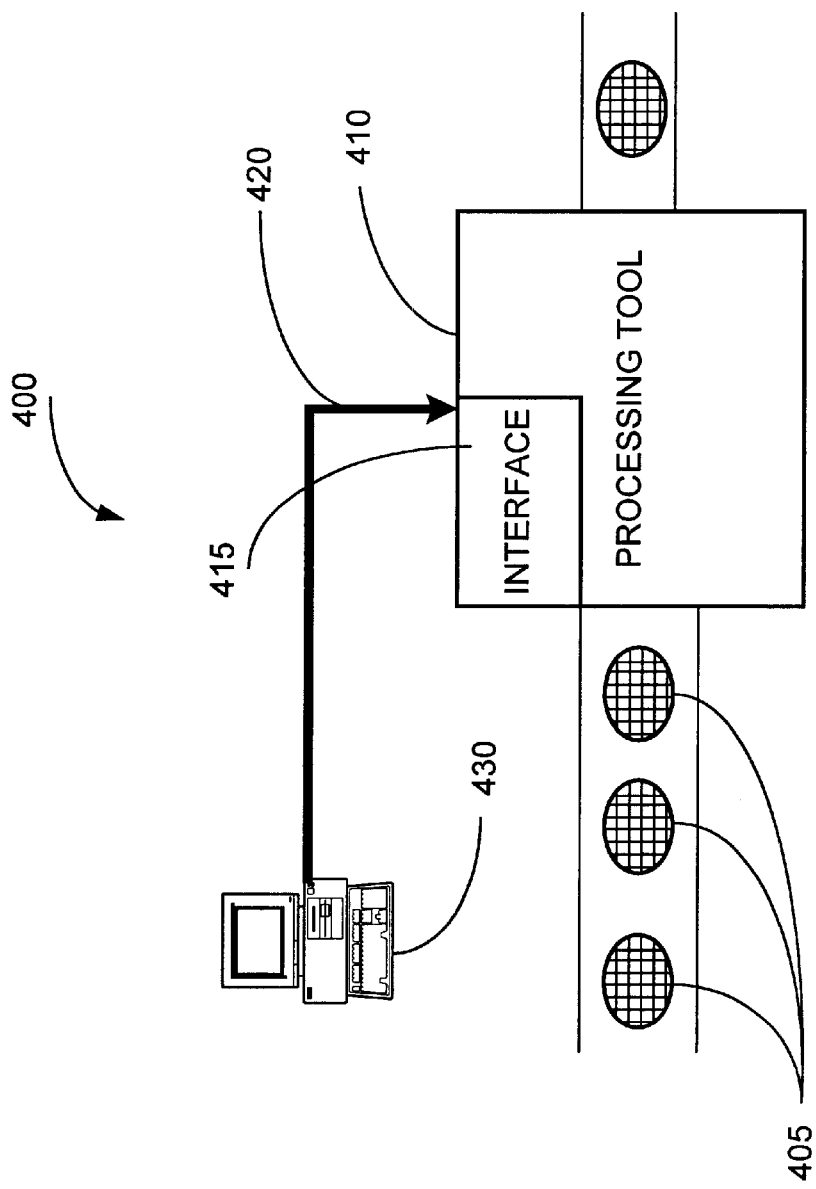
FIG. 4 illustrates a block diagram of an automatic process controller (APC) useful in controlling the fabrication of the semiconductor devices illustrated in FIGS. 1–3.
Figure 5:
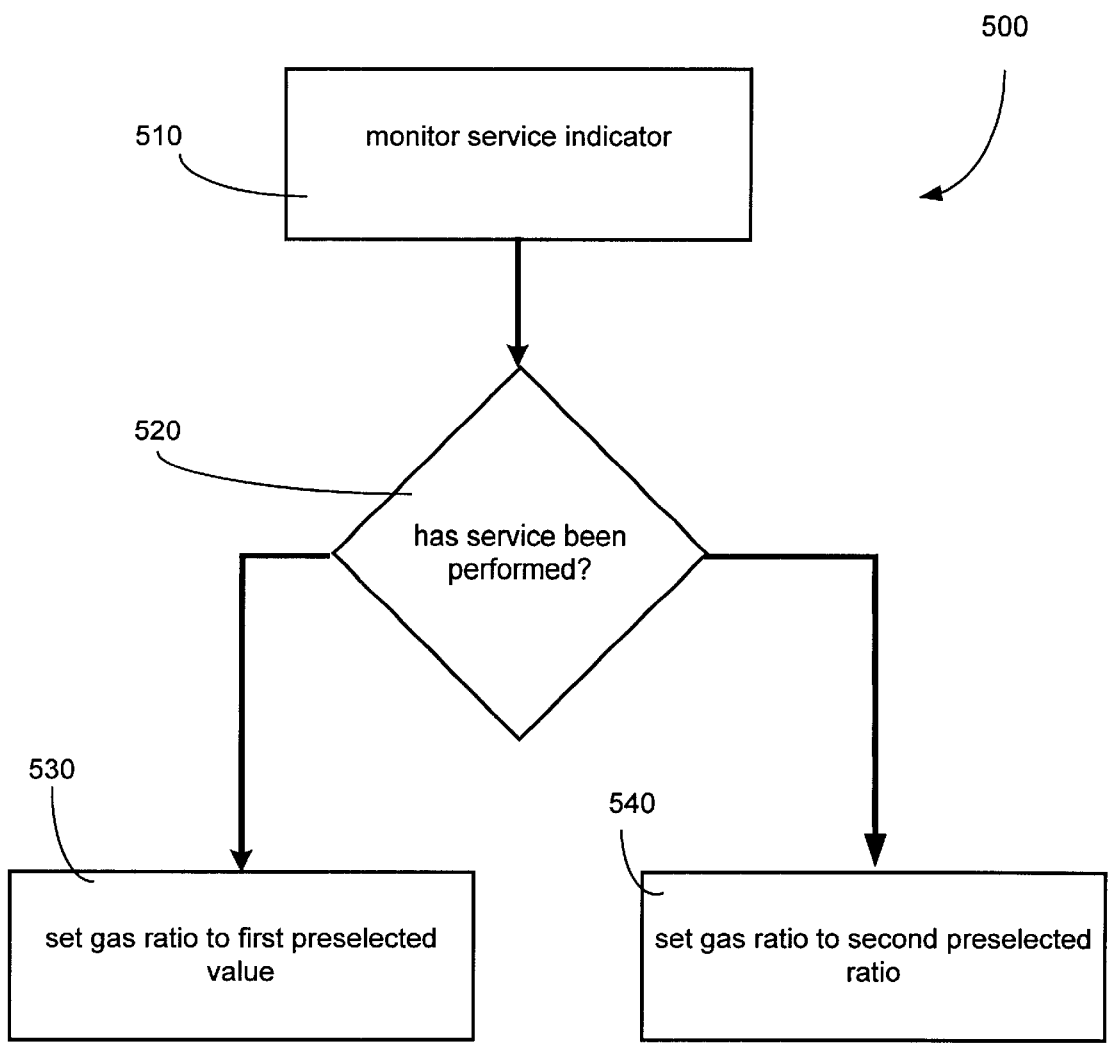
FIG. 5 illustrates a flow chart of a process used in the APC of FIG. 4 to control the formation of a bottom antireflective coating (BARC) layer in the semiconductor devices of FIGS. 1–3.

Referring now to FIGS. 4 and 5, an exemplary automatic process controller (APC) 400 and process 500 for controlling the formation of the BARC layer 120 are illustrated. Semiconductor products 405, such as semiconductor wafers, are processed on a semiconductor processing tool 410 using a plurality of control input signals on a line 420. In one exemplary embodiment, the semiconductor processing tool 410 is a deposition tool configured to form the BARC layer 120 on the wafers 405. The control input signals on the line 420 are sent to the processing tool 410 from a computer system 430 via an interface 415. In one embodiment, the interface 415 is located outside the processing tool 410. In an alternative embodiment, the interface 415 is located within the processing tool 410. The control input signals on the line 420 enable the computer system 430 to vary certain operating parameters of the processing tool 410. For example, the computer system 430 controls the introduction of gases into the processing tool 410 during the formation of the BARC layer 120. In fact, the computer system 430 controls the ratio of the gases used in the formation of the BARC layer 120, such as the ratio of silane to nitrous oxide. The computer system 430 is also capable of controlling other parameters that have an impact on the values n and k. For example, varying the timing of the introduction of the gases relative to the introduction of RF power, and varying the amount of oxidation during a post deposition plasma treatment step may also be used to control the optical parameters n and k.

One instance in which it is desirable to control or vary the optical parameters n and k is after the tool 410 has been serviced. That is, the tool 410 is routinely shut down or taken off-line for cleaning to ensure continued proper operation and/or long life. It has been observed that cleaning the tool 410 can affect the properties of the BARC layer 120 subsequently formed in the tool 410. In particular, the optical properties, n and k, of the BARC layer 120 have been observed to change significantly following a cleaning operation, and in particular, an insitu cleaning.

The interface 415 also allows an operator to communicate information to the computer system 430. Thus, in one embodiment of the instant invention, the operator or maintenance personnel communicates the fact that the tool 410 has been cleaned to the computer system 430 via the interface 415. The method of communication can be accomplished in any of a variety of well-known manners, including but not limited to, an alpha or numeric keypad (not shown), a conventional pushbutton switch (not shown), a touch sensitive screen (not shown), etc.

The computer system 430 operates under the control of software, such as that represented in flowchart form in FIG. 5. The flowchart representation of FIG. 5, of course, represents only that portion of the software that facilitates control of the gas ratio in the tool 410, which may be only a small portion of the control software operating on the computer system 430. To avoid unnecessarily obscuring the instant invention, the remaining software is not described in detail herein.

Software control of the computer system 430 begins at block 510 with the computer system 430 checking the status of the service indicator. That is, the software polls, interrupts, or queries the interface 415 to determine if the operator or maintenance personnel have performed any service on the tool 410, such as an insitu cleaning. At block 520 the computer system 430 determines whether such service has been performed. If the service has not been performed, control branches to block 530 where the gas ratio is set to a first preselected value. That is, if no service has been performed, the gas ratio is set to remain at its current level. On the other hand, if an insitu cleaning has been performed, control transfers to block 540 where the gas ratio is set to a second preselected ratio. That is, if an insitu cleaning has been performed, then the gas ratio is changed to maintain the optical parameters of the BARC layer 120.

Selection of the second preselected ratio may be accomplished by any of a variety of methods. For example, the value of the second preselected ratio may be based upon historical data. That is, the second preselected ratio could be set to the gas ratio that was necessary to produce the desired optical properties after insitu cleanings in the past, or to some average past value. Alternatively, the second preselected ratio could be derived by determining the historical change in the gas ratio that was used to produce the desired optical properties. That is, this historical change could be applied to the current gas ratio to arrive at the second preselected ratio.

Alternatively, the computer system 430 may control the timing of the introduction of the gases and applying RF power. That is, the parameters n and k may be increased by first introducing the silane gas and then applying RF power. In one embodiment, the RF power is applied approximately one second after the silane gas is introduced. Similarly, the parameters n and k may be varied by varying the amount of oxidation during a post deposition plasma treatment step.

Figure 6:
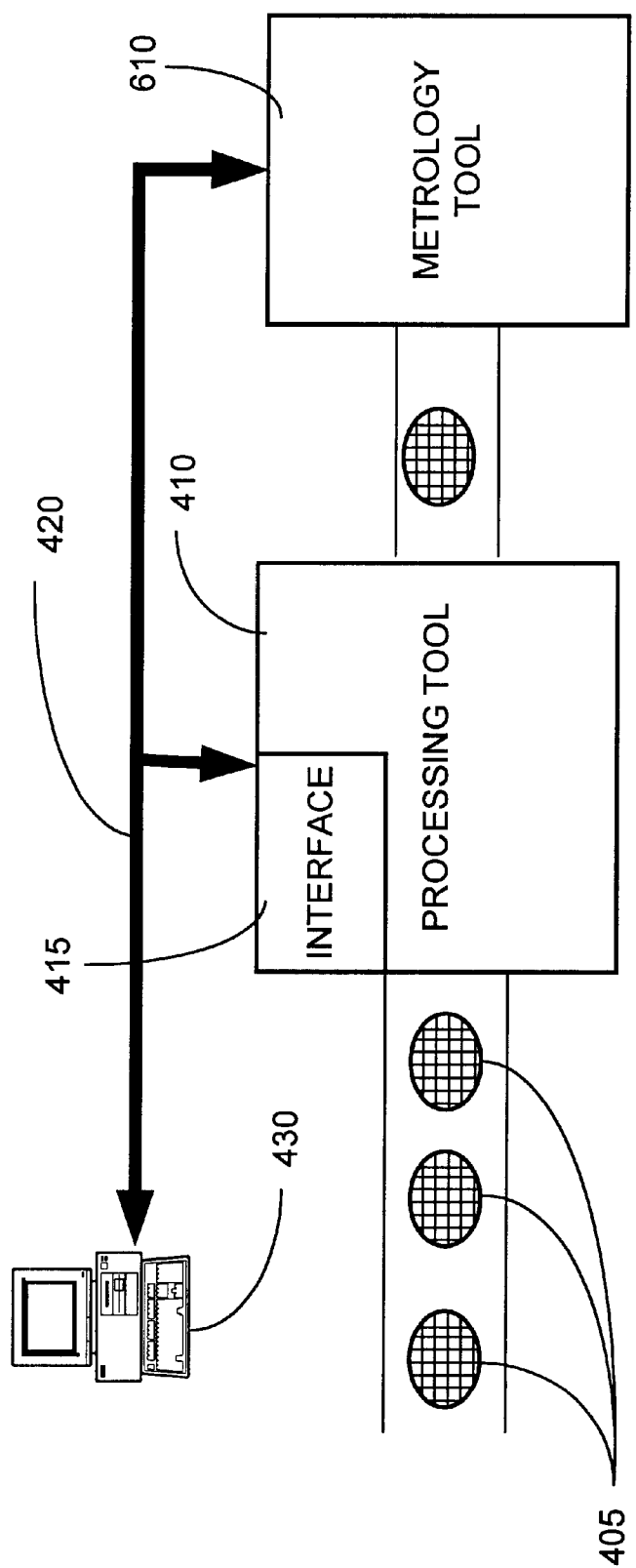
FIG. 6 illustrates a block diagram of an alternative embodiment of an automatic process controller (APC) useful in controlling the fabrication of the semiconductor devices illustrated in FIGS. 1–3.
Figure 7:
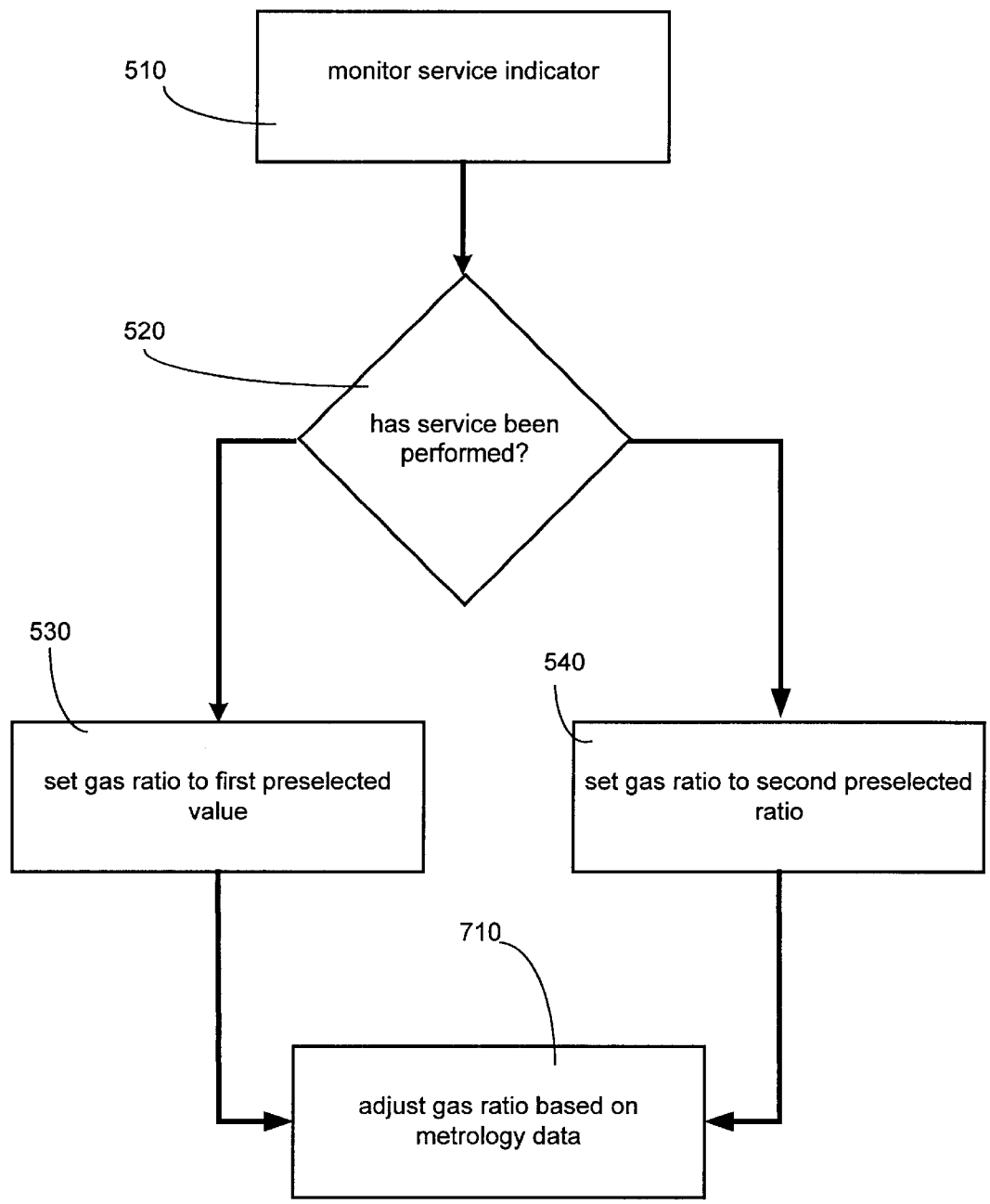
FIG. 7 illustrates a flow chart of a process used in the APC of FIG. 6 to control the formation of a bottom antireflective coating (BARC) layer in the semiconductor devices of FIGS. 1–3.

In an alternative embodiment shown in FIGS. 6 and 7, the optical properties, n and k, of the bottom antireflective coating layer 120 may be measured, either directly or indirectly, by a metrology tool 610. Rather than relying solely on the service signal to indicate a change in the semiconductor processing tool 410, the measured optical parameters can be delivered back to the computer system 430. A control algorithm encoded in software in the computer system 430 can use these signals to vary the ratio of gases delivered to the processing tool 410 so as to control the optical parameters of subsequently processed wafers 405. A Conventional metrology tool, such as a UV Refractometer Spectrometer available from Thermowave as an Optiprobe 3260DUV, may be employed to measure the optical parameters, n and k. For example, in the case where the optical parameter n is measured to be higher than desired, the computer system 430 may alter the ratio of gases such that, for example, the amount of silane is reduced relative to the amount of nitrous oxide. Similarly, when n is measured to be below the desired value, the amount of silane may be increased relative to the amount of nitrous oxide.

Thus, in the embodiment of the software illustrated in FIG. 7, at block 710 the first and second preselected ratios may be further modified based on the data gathered by the metrology tool 610. That is, the metrology data may be used to continually update the gas ratio being used in the tool 410 to account for changing properties in the chamber of the tool 410, other than than those caused by a service operation. The block 710 may be used to continuously fine tune the gas ratio being used in the tool 410, whereas the block 540 may be used to correct for step function like changes in the desired gas ratio.

The above-disclosed embodiments of a method of manufacturing semiconductor devices with reduced critical dimensions enables the formation and patterning of components such as gate conductors and gate dielectrics on much reduced scales, consistently, robustly and reproducibly, and in a self-aligned manner. Any of the above-disclosed embodiments of a method of manufacturing semiconductor devices with reduced critical dimensions enables the achievement of reduced critical dimensions using photolithography without problems associated with reflections or refractions from the inorganic bottom anti-reflective coating (BARC). By controlling the optical parameters, n and k, of the BARC during semiconductor manufacturing, the number of photolithography reworks may be reduced, decreasing manufacturing costs and increasing throughput, more effectively and more stably than with conventional techniques.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for processing semiconductors, comprising:
   forming a first layer above a substrate layer;
   receiving a signal indicating that a semiconductor processing tool has been serviced;
   forming an inorganic antireflective coating layer above the first layer by introducing at least two gases at a first preselected ratio into said semiconductor processing tools; and
   varying the ratio of the gases in response to receiving the signal.

2. The method of claim 1, wherein forming the inorganic antireflective coating layer comprises introducing the at least two gases at a first preselected ratio to achieve preselected optical properties.

3. The method of claim 1, wherein forming the antireflective coating layer comprises introducing silane and nitrous oxide into said semiconductor processing tool.

4. The method of claim 1, wherein forming the antireflective coating layer comprises forming the antireflective coating layer having a thickness in the range of about 100 to 500 Å.

5. The method of claim 1, wherein receiving the signal comprises receiving the signal in response to the semiconductor processing tool having been cleaned.

6. The method of claim 1, wherein receiving the signal comprises receiving the signal in response to the semiconductor processing tool having been cleaned in situ.

7. The method of claim 1, wherein forming the first layer comprises forming the first layer of at least one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, and barium strontium titanate.

8. The method of claim 1, wherein forming the first layer comprises forming the polysilicon, aluminum (Al), titanium (Ti) zirconium (Zr), tungsten (W), tantalum (Ta), nickel (Ni), molybdenum (Mo), and cobalt (Co).

9. The method of claim 1, wherein forming the first layer comprises forming the first layer using at least one of chemical vapor deposition (CVD), low-pressure CVD (LPCVD), plasma-enhanced CVD (PECVD), sputtering, physical vapor deposition (PVD), high-density ionized metal plasma (IMP) deposition, and high-density inductively coupled plasma (ICP) deposition.

10. The method of claim 1, wherein varying the ratio of the gases comprises varying the ratio to a second preselected ratio.

11. The method of claim 1, wherein varying the ratio of the gases comprises varying the ratio using measured optical properties of the antireflective coating.

12. A method for processing semiconductors, comprising:
    forming a first layer above a substrate layer;
    receiving a signal indicating that a semiconductor processing tool has been serviced;
    forming an inorganic antireflective coating layer above the first layer, said inorganic antireflective coating layer having optical parameters; and
    varying the optical parameters in response to receiving the signal.

13. The method of claim 12, wherein forming an inorganic antireflective coating layer comprises introducing the at least two gases at a first preselected ratio to achieve preselected optical properties, and varying the optical parameters comprises varying the ratio of the two gases.

14. The method of claim 13, wherein forming the antireflective coating layer comprises introducing silane and nitrous oxide into said semiconductor processing tool.

15. The method of claim 13, wherein varying the ratio of the two gases comprises varying the ratio to a second preselected ratio.

16. The method of claim 13, wherein varying the ratio of the two gases comprises varying the ratio using at least one measured optical property of the antireflective coating.

17. The method of claim 12, wherein varying the optical parameters comprises varying the amount of oxidation during a post deposition plasma treatment step.

18. The method of claim 12, wherein forming an inorganic antireflective coating layer comprises introducing the at least two gases at a first preselected ratio to achieve preselected optical properties, and varying the optical parameters comprises applying RF power a preselected period of time after at least one of the gases is introduced.

19. The method of claim 18, wherein applying RF power comprises applying RF power about one second after at least one of the gases is introduced.

20. The method of claim 18, wherein introducing the at least two gases comprises introducing silane and nitrous oxide into said semiconductor processing tool.

21. The method of claim 20, wherein applying RF power comprises applying RF power about one second after silane is introduced.

* * * * *